United States Patent
Appinger et al.

(10) Patent No.: US 7,225,376 B2
(45) Date of Patent: May 29, 2007

(54) METHOD AND SYSTEM FOR CODING TEST PATTERN FOR SCAN DESIGN

(75) Inventors: Joerg Georg Appinger, Aidlingen (DE); Michael Juergen Kessler, Herrenberg (DE); Manfred Schmidt, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 484 days.

(21) Appl. No.: 10/630,957

(22) Filed: Jul. 30, 2003

(65) Prior Publication Data

US 2004/0064771 A1    Apr. 1, 2004

(30) Foreign Application Priority Data

Jul. 30, 2002    (EP) ................... 02102070

(51) Int. Cl.
  *G01R 31/28*    (2006.01)
  *G06F 11/00*    (2006.01)
  *G06F 17/00*    (2006.01)
(52) U.S. Cl. .............. 714/738; 714/739; 714/726; 714/733; 714/724; 716/4
(58) Field of Classification Search ............... None
  See application file for complete search history.

(56) References Cited

U.S. PATENT DOCUMENTS 5,991,909 A * 11/1999 Rajski et al. ............. 714/729
6,029,261 A * 2/2000 Hartmann ................. 714/724
2003/0149913 A1 * 8/2003 Balachandran et al. ....... 714/30

OTHER PUBLICATIONS

"LFSR-Coded Test Patterns for Scan Designs" by B. Konemann, pp. 237-242.
"Decompression of Test Data Using Variable-Length Seed LFSRs" by J. Rajski et al, 1995 IEEE, pp. 426-433.

* cited by examiner

*Primary Examiner*—Phung My Chung
(74) *Attorney, Agent, or Firm*—Eugene I. Shkurko

(57) ABSTRACT

A method and system for efficiently coding test pattern for ICs in scan design and build-in linear feedback shift register (LFSR) for pseudo-random pattern generation. In an initialization procedure, a novel LFSR logic model is generated and integrated into the system for test data generation and test vector compression. In a test data generation procedure, test vectors are specified and compressed using the LFSR logic model. Every single one of the test vectors is compressed independently from the others. The result, however, may be presented all at once and subsequently provided to the user or another system for further processing or implementing in an integrated circuit to be tested. According to the present invention a test vector containing 0/1-values for, e.g., up to 500.000 shift registers and having, e.g., about 50 so called care-bits can be compressed to a compact pattern code of the number of care-bits, i.e., 50 bits for the example of 50 care-bits.

28 Claims, 11 Drawing Sheets

LFSR Generator Code
*representation of LFSR over a certain number of cycles*

Chain Access Operator (optional)
*representation of XOR-SPREADER* data-out-bit for multiple scan chain

BIT-Code representation

850 → State Function    $(F^x)_n = R_n \circ A^x$

Chain Access Operator    $A^x = A \circ P^x$

A   Basic Access Operator $P^x$   Shift Operator for chain $x = 0, 1, 2, 3, 4$ $R_n$   LFSR Generator Code $n = 0, 1, 2, ...$ cycles Spreader XOR-Network
for multiple scan chain BIT-Code representation 940      State Function    $(F^{xy})_n = R_n \circ A^{xy}$

Chain Access Operator    $A^{xy} = A \circ (P^x + P^y)$

A    Basic Access Operator $P^x$    Shift Operator for access $x = 0, 1, 2, 3, 4$ $R_n$    LFSR Generator Code   $n = 0, 1, 2,...$ cycles

METHOD AND SYSTEM FOR CODING TEST PATTERN FOR SCAN DESIGN

BACKGROUND OF THE INVENTION

The present invention generally relates to testing of integrated circuits (ICs) in scan designs. Particularly, the present invention relates to a method and device for coding test vectors for scan design.

Testing of integrated circuits (ICs) includes several components, which are part of a comprehensive test procedure, namely, "External Automatic Test Equipment" (ATE), "IC built-in self-test hardware" (BIST), and "Automatic Test Pattern Generation" (ATPG) software.

External Automatic Test Equipment stores test data and controls the ICs under test via a restricted number of Primary Inputs (PIs) for signal and data input, whereas IC built-in self-test hardware generates pseudo-random test vectors and response signatures. Automatic Test Pattern Generation (ATPG) software generates test data for Deterministic Stored Pattern Test (DSPT) and simulates test execution of both BIST and DSPT.

In order to reduce costs for expensive ATEs numerous BIST schemes have been proposed in recent years. They incorporate built-in features to apply test vectors to the tested circuit and to evaluate the resulting responses. A number of different methods to generate exhaustive, random, weighted random and deterministic test vectors have been developed. An ideal method should guarantee complete fault coverage, obtained with low hardware overhead and within short test application time.

Mixed-mode oriented testing exploits BIST and DSPT to achieve complete fault coverage. Pseudo-random vectors are applied to cover the easy-to-test faults, while deterministic vectors target the remaining hard-to-test faults. In the future the amount of memory required for explicitly storing deterministic test data will grow and may get too large for practical implementation. As a solution LFSR-Coding, also known as Re-Seeding, has been proposed to compress and decompress test data.

LFSR-Coding is characterized by the fact that expansion of compressed stored test data is done by a hardware structure already available for BIST. However, in order to meet both, fast BIST and efficient LFSR-Coding several refinements and extensions to the basic LBIST hardware have been proposed.

Rajski et al., 1995, IEEE, "Decompression of Test Data Using Variable-Length Seed LFSRs" proposes the use of Multiple Polynomial Linear Feedback Shift Register (MP-LFSR) to support LFSR-Coding in Variable-Length Seed.

U.S. Pat. No. 5,991,909 by Rajski et al., assigned to Mentor Graphics Corporation, Wilsonville, Oreg., US, filed, Oct. 15, 1996, issued Nov. 23, 1999, "Parallel Decompression And Related Methods And Apparatuses" describes parallel decompression using multiple scan chains and multiplexers to merge ATE stored data in pseudo-random vectors generation.

Könemann, 1991, ITL Munich, Germany, "LFSR-Coded Test Pattern for Scan-Design" discusses an alternative method for compact test data storage which achieves full test coverage, but is more compatible with system level Self-Test than with Weighted Random Pattern (WRP) test is. Intelligent, constructive Re-Seeding of a linear Pseudo Random Pattern Generator (PRPG) is used to manipulate the generated patterns as required for full fault testing. The required data storage volume, number of test pattern, test application time, and on-product hardware overhead for state-of-the art CMOS chip example is estimated based on theoretical considerations.

Considering current ATPG systems LFSR-Coding for such hardware structure are not yet supported or only with low efficiency. They basically consist of modules for deterministic and pseudo-random test vector generation for fault simulation and features to control the chip under test. A possibility for LFSR-Coding is to use common cycle simulation, but this method results in very low efficiency.

BRIEF SUMMARY OF THE INVENTION

The object of the present invention is to provide a method and a device for efficiently coding test vectors for scan design.

According to the present invention a method and a system is provided for efficiently coding test vectors for ICs in scan design and with buildin test hardware (BIT-HW), whereby the BIT-HW consists of a linear feedback shift register (LFSR) for pseudo-random pattern generation and means for pattern merging and distribution over scan chains. The method in particular includes the generation of an executable logic model representation of the physical BIT-HW, here called BIT-Code.

In an initialization procedure, the BIT-Code is generated and integrated into the system for test data generation and test vector compression.

In a test data generation procedure, test vectors are specified, and compressed using the BIT-Code. Every single one of the test vectors is compressed independently from the others to a so-called LFSR-Code. The total of compressed LFSR-Codes, however, may be presented all at once and subsequently provided to the user or another system for further processing or implementing in an integrated circuit to be tested.

In a special test data generation procedure, the total of compressed LFSR-Codes are sorted and grouped by the individual lengths and stored in separate data records having suitable formats for each length interval.

In another special test data generation procedure, the compression is combined with a simulation of the compressed LFSR-Codes to be presented to the user or another system for further processing.

In a preferred embodiment of the present invention the LFSR logic model is derived from respective integrated circuit (IC) design data. Advantageously, the test vectors are derived from the integrated circuit design data.

In another embodiment of the present invention, in an initial step integrated circuit design data are provided. Advantageously, in the test vectors care-bits are specified having either the logical value 1 or 0.

A special BIT-Code contains a LFSR Generator Code and an access operator for computing a certain state-function for each care-bit. In a multiple scan chain design there is one chain access operator for each chain representing means for merging and distributing the pseudo-random patterns generated by the LFSR over the various scan chains.

In a preferred embodiment the LFSR Generator Code is a binary vector and the access operator a binary square matrix.

Another special LFSR logic model representation contains a LFSR Generator Matrix build by the total of state-functions that is including all bit positions of a test vector, which possibly can be specified as care-bits. Another special LFSR logic model representation contains for each scan chain a respective LFSR Generator Matrix.

According to the position of the care-bits in the test vector, the corresponding state-functions are computed from the LFSR Generator Code or selected out of the LFSR Generator Matrix, respectively. The resulting collection of state-functions forms a linear equation system, which is solved to create the compressed LFSR-code of the test vector.

In a preferred method for solving the equation system, a special solution characterized by a maximum sequence of value repetitions, that is normally a right adjusted sequence of zeros, is provided to be used as compressed LFSR-code.

For test execution the LFSR-code is loaded into the build-in LFSR hardware for seeding. With this seed the LFSR generates a test pattern with the specified care-bit 0/1-values; all other bit positions are padded by randomized 0/1-values.

Automatic Test Pattern Generation (ATPG) for very large IC (Integrated Circuit) chips is a complex process, which requires long run times on large computer systems. Typically, the process of Automatic Test Pattern Generation is not straightforward and requires several iterations to achieve the maximum in test coverage. The result is a mix of DSPT (Deterministic Stored Pattern Test) and BIST (Built-In Self-Test) oriented testing, which is customized to the available ATE (Automatic Test Equipment) and BIST hardware of the chip under test.

Major components of conventional ATPG systems are on one hand pseudorandom pattern generator and BIST execution simulator for BIST, and on the other hand, deterministic pattern generator, test execution simulator and test vector concatenation for DSPT.

In the future, because of the test data volume, it gets more and more important to provide an ATPG systems having facilities to compress deterministic test vectors in order to reduce stored test data volumes in DSPT. LFSR-Coding may be employed as a suitable compression method. It uses build-in LFSR type hardware for decompression. In other words, the LFSR hardware may be used to generate pseudorandom test vectors for BIST and decompress LFSR-Coded deterministic test vectors for DSPT. It should be noted that fast BIST in combination with efficient LFSR-Coding in general requires more complex structures than known in common LBIST.

For the following description we use the term BIT-HW referring to Build-In Test Hardware used for combined BIST and LFSR-Coding.

While several hardware structures for BIT-HW are under discussion there is no or little investigation in ATPG support requirements. Indeed ATPG support surely needs special procedures to achieve highly efficient LFSR-Coding. This is true because of the complex structure of BIT-HW, the huge amount of test vectors to be compressed and the iterative and time-consuming procedure of ATPG systems. In summary, ATPG support for LFSR-Coding is not on the focus and there is no known solution.

The present invention solves this problem by a specific method, which transforms the sequential logic design of BIT-HW into a non-sequential representation as a base for fast LFSR-Coding.

In other words, the present invention solves the given object by a novel procedure for LFSR-Coding, which uses static tables to represent dynamic execution of sequential logic. High efficient LFSR-Coding is very advantageous because of the very complex test environment, which is characterized by a huge amount of long test vectors distributed over complex networks into many parallel scan chains.

BRIEF DESCRIPTION OF THE SEVERAL VIEWS OF THE DRAWING

These and other objects will be apparent to one skilled in the art from the following detailed description of the invention taken in conjunction with the accompanying drawings in which.

Figure 1:
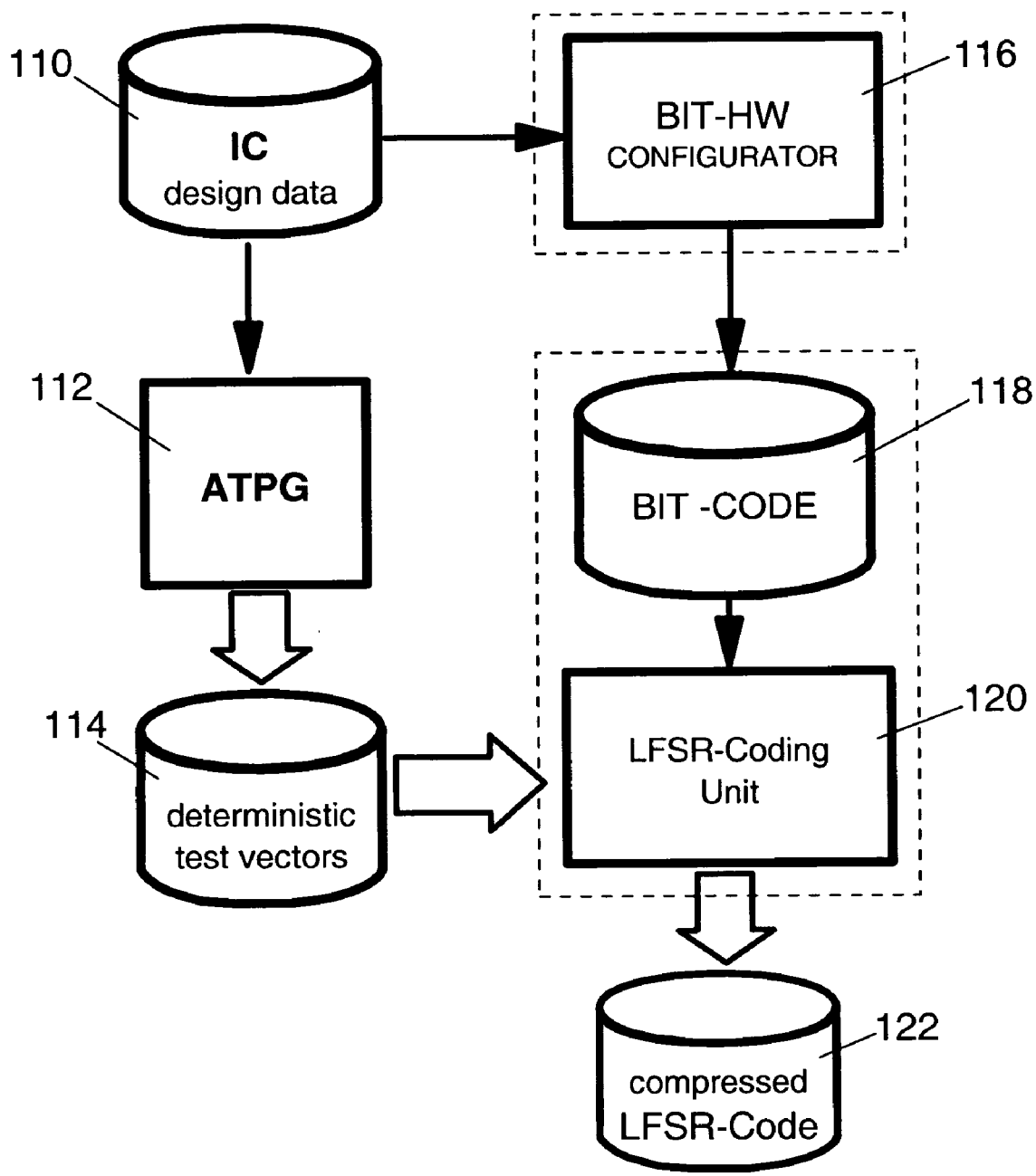
FIG. 1 shows a block diagram giving an overview of LFSR-Coding Procedure according to the present invention.

DETAILED DESCRIPTION OF THE INVENTION:

With reference now to FIG. 1, there is depicted a block diagram giving an overview of LFSR-Coding Procedure according to the present invention.

The flow on the left hand side includes block 110 illustrating a storage unit for keeping IC design data, an ATPG system (block 112) and a storage unit for keeping deterministic test vectors (block 114). These three blocks refer to common DSPT procedures.

The ATPG system (block 112) generates deterministic test vectors from IC design data (block 110). It should be noted that the resulting volume of test vectors (block 114) is extremely high for large ICs.

The flow on the right hand side includes a BIT-HW configurator (block 116), a storage unit for keeping BIT-Code (block 118), an LFSR-Coding Unit (block 120) and a storage unit for keeping compressed LFSR-Code (block 122). This flow refers to the LFSR-Coding procedure as introduced by this invention.

The outputs are compressed test vectors (LFSR-Code, block 122) to be stored at ATE (not shown in FIG. 1). The decompression is done on chip by a suitable BIT-HW as described further below.

The BIT-HW configurator (block 116) may advantageously be implemented as a computer program and is executed once for a certain IC design. It generates from IC design data (block 110) a particular data file, called BIT-CODE (block 118). The BIT-CODE (block 118) can be considered as a logic model representation of the physical BIT-HW design.

The LFSR-Coding Unit (block 120) may advantageously be implemented as a computer program, which gets executed for each test vector to be compressed. The compression algorithm is universal in the sense that all design specific information is located in the BIT-CODE (block 118). The compression runs extremely fast, whereby the length of the test vectors and the complexity of the BIT-HW structures have none or little impact.

The LFSR-Coding Unit (block 120) may be considered as a special application, which uses BIT-Code (block 118). In this sense other possible applications are for example in the field of formal design verification and straightforward simulation.

Figure 2:
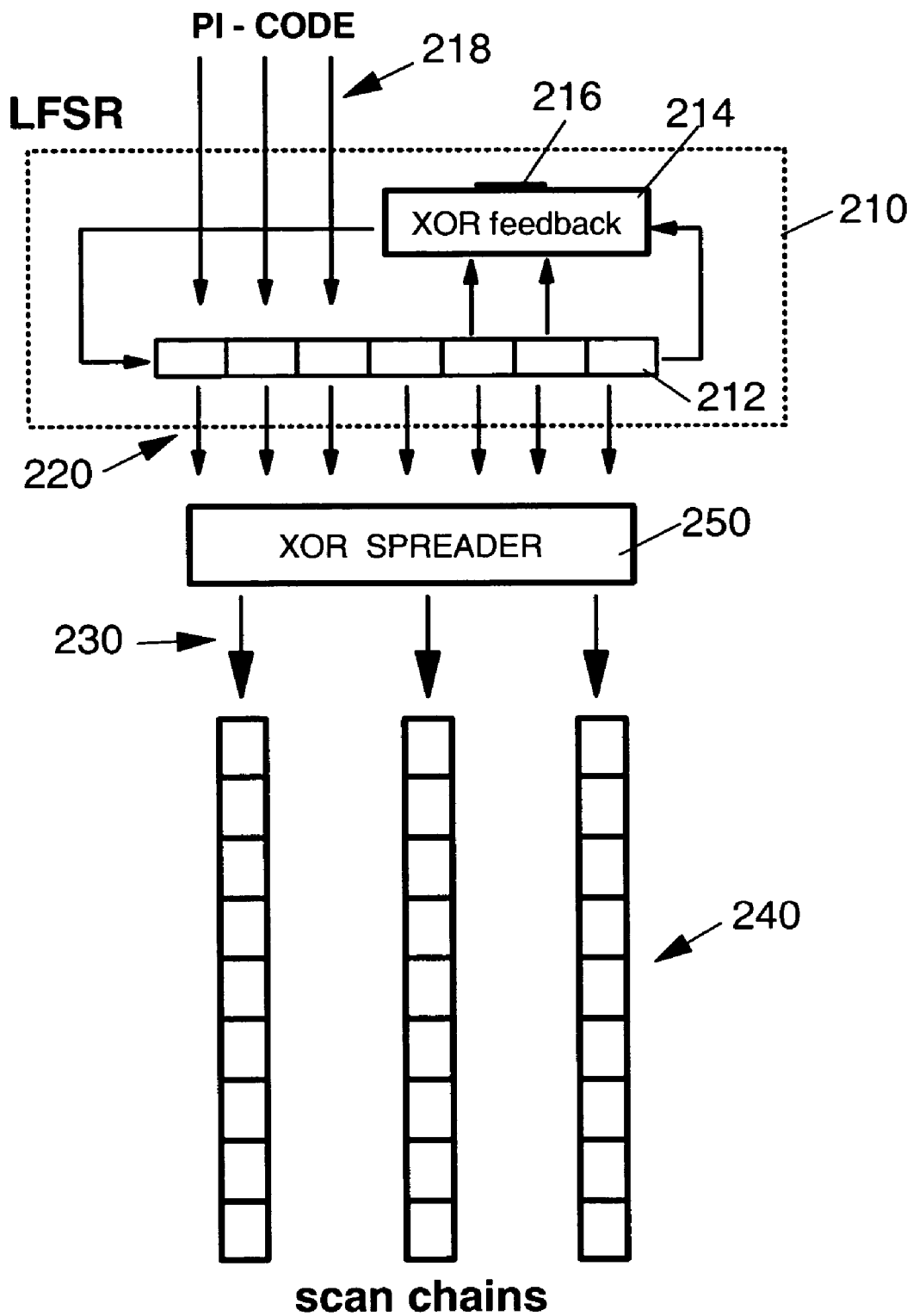
FIG. 2 shows a block diagram illustrating schematically the main components of the considered built in test hardware (BIT-HW)

Now with reference to FIG. 2, there is depicted a diagram schematically illustrating the major components of the considered Build-In Test Hardware (BIT-HW) 200.

A basic configuration consists of the Linear Feedback Shift Register (LFSR) 210 only. A shift register 212 and a feedback network 214, which may include a selection unit 216 for polynomial selection in a multiple-polynomial LFSR. The LFSR 210 may be provided with input ports 218 for entering PI-Code and output ports 220 for outputting test data from the shift register 212.

In addition, the BIT-HW 200 may include an additional spreader network 250. The spreader network 250 may be used to generate multiple scan chains 240. Additional networks, e.g., a merger network may be provided for test data from ATE to the cycling LFSR (not shown).

The only Boolean function used within the BIT-HW 200 is Exclusive-Or (XOR). This is true for the logic in the feedback network 214 of the LFSR 210, in the spreader network 250 and in the merger network, if used. All registers are of type Linear Shift Register (LSR). This is true for the shift register 212 of the LFSR 210 and the scan chains 240. The invention makes use of this specific hardware structures for defining the BIT-CODE as described below.

Figure 3:
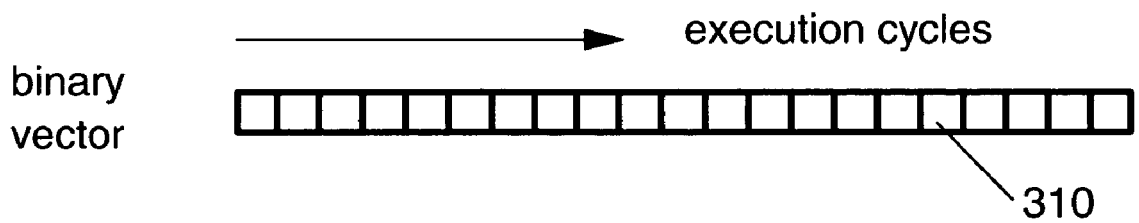
FIG. 3 shows schematically the major components of the BIT-CODE according to the present invention.
Figure 3:
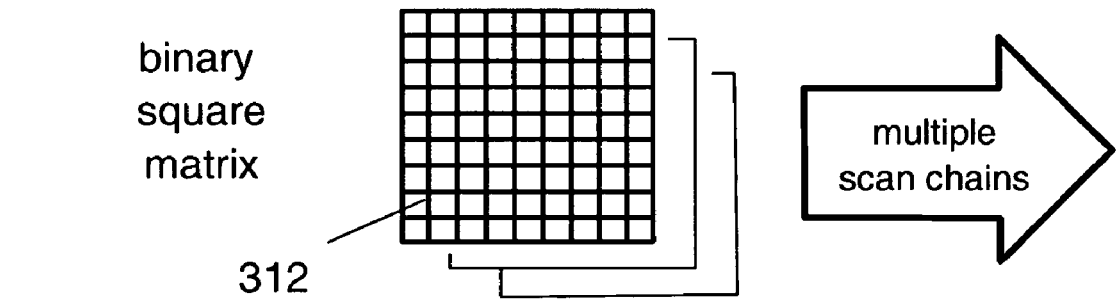

FIG. 3 shows schematically the major components of the BIT-Code according to the present invention. With reference to FIG. 2 the BIT-HW is represented by the BIT-CODE as follows:

The LFSR-Generator Code 310 in form of a binary vector represents the LFSR, over an interval of n execution cycles. The dimension of the binary vector 310 is the number of execution cycles.

A predetermined interval of n execution cycles shall be taken into account and a non-sequential logic model may be constructed representing the LFSR in this interval. For LFSR-Coding the interesting interval corresponds directly to the length of the scan chains, which is a relatively low number (about 1000, corresponding to 1000 cycles). Since LFSRs are finite state machines the length of the interval limits the number of possible states. That means that the LFSR-Generator Code 310 can describe the functional behavior of LFSRs without any restriction.

In this sense, the LFSR-Generator Code 310 is a logic model, which substitutes the functional behavior of the LFSR in a certain interval of n execution cycles. More precisely, it substitutes LFSR executions of the following n cycles sequences:

(1), (1+2), (1+2+3), . . . , (1+2+3+ . . . +n).

These n substitutions shall be called state-functions $F_n$. They can be considered as a list of Boolean functions defining a non-sequential logic model in the sense that execution is performed immediately, i.e., in one cycle.

An Access Operator 312 illustrated by a binary square matrix, is another major component of the BIT-Code. The square matrix corresponds to the length of the LFSR. For a basic BIT-HW consisting of a LFSR only as shown below in FIG. 5, a Basic Access Operator shall be considered as a function which encodes LFSR-Generator Code 310 to state-functions $F_n$. Further, for BIT-HW extended by XOR-Spreader for multiple scan chains a Chain Access Operator 312 also includes the specific XOR-functions needed to transform LFSR Generator Code 310 for a certain scan chain. In this sense there is a set of Chain Access Operators 312, one for each scan chain and each combines two functions, namely, decoding of LFSR-Generator Code 310 and transformation to executable XOR-functions (state-functions) according to the spreader XOR-network.

Finally, the solution according to the present invention is implemented by use of binary data structures to represent Boolean functions and register shift operations in terms of linear algebra. Here the invention makes use of the fact, that the considered BIT-HW consists of no other circuits than shift registers (SRs) and XOR-networks (cf. above). The advantages are compact coding, open structure and fast computation.

Figure 4:
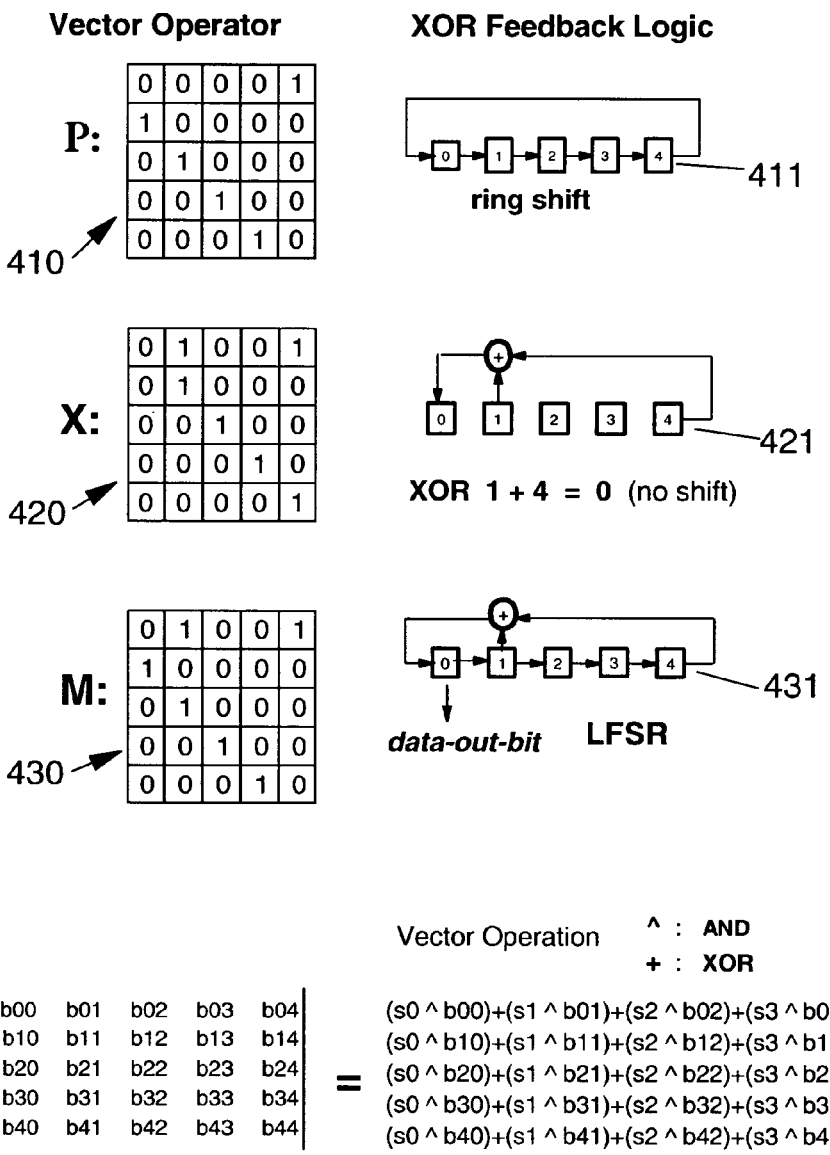
FIG. 4 shows how BIT-HW can be represented in terms of linear algebra in XOR-arithmetic.

FIG. 4 shows how BIT-HW can be represented in terms of linear algebra in XOR-arithmetic as known from the art. The square matrices 410, 420 and 430 on the left can be considered as model representations of the related hardware structures 411, 421 and 431 on the right of FIG. 4. The block on bottom illustrates matrix multiplication in XOR arithmetic as usual. In this view the vector on the left are the actual binary register values and the expression on the left represents the resulting values after cycle execution. Thus the square matrix represents the Boolean function of this hardware. For more details please refer to Albrecht P. Ströle, "Entwurf selbsttestbarer Schaltungen, Teubner-Texte zur Informatik—Band 27", B. G. Teubner Stuttgart—Leibzig, ISBN 3-8154-2314-7, page 84 and FIG. 8 on page 86.

In the following the basic components of BIT-HW Configurator (FIG. 1, 116) is explained with reference to the FIGS. 5 and 6. The Access Operator is explained with reference to FIGS. 7, 8, 9 and 10.

Figure 5:
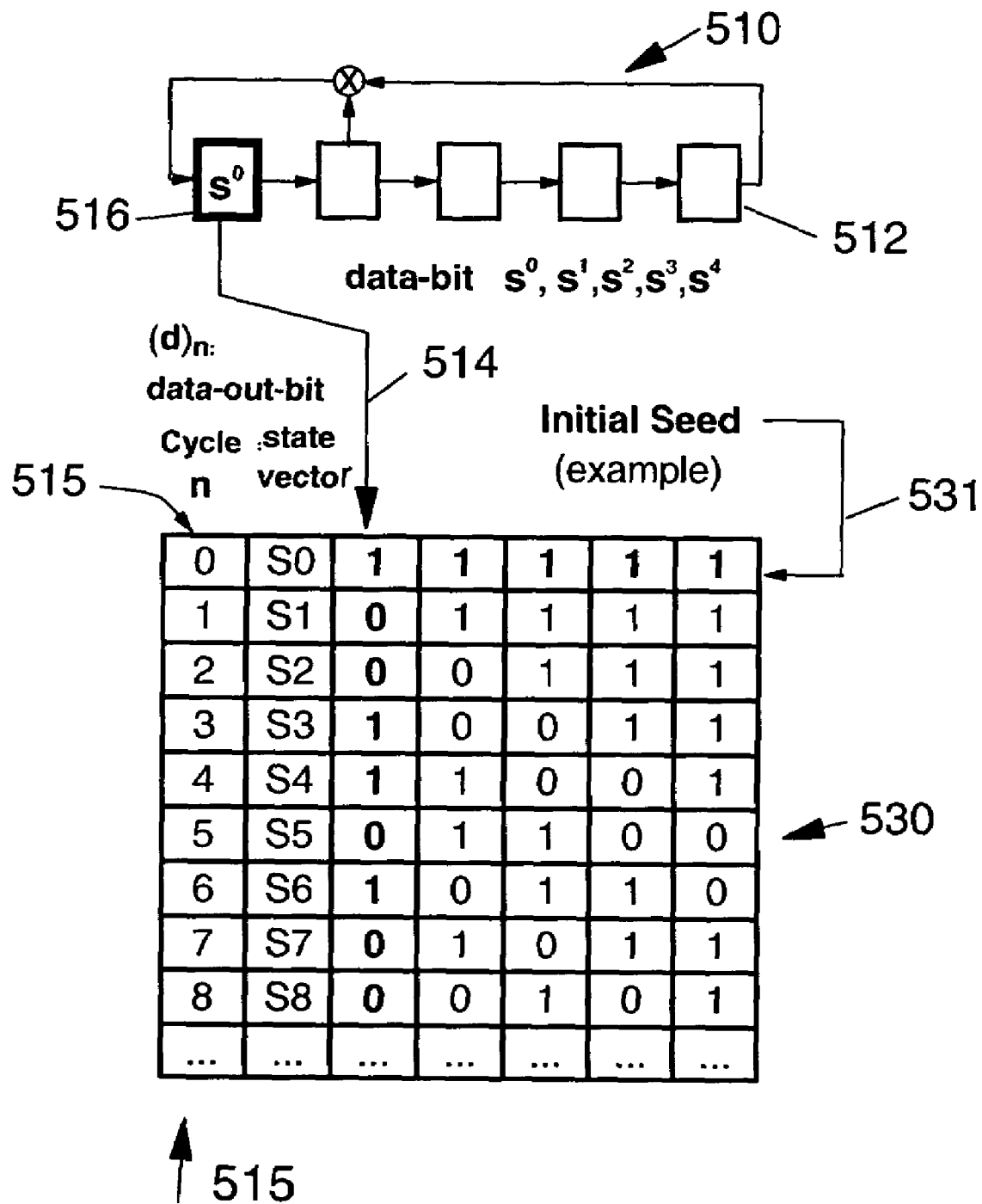
FIG. 5 shows schematically a linear feedback shift register (LFSR) as an example of BIT-HW.
Figure 6:
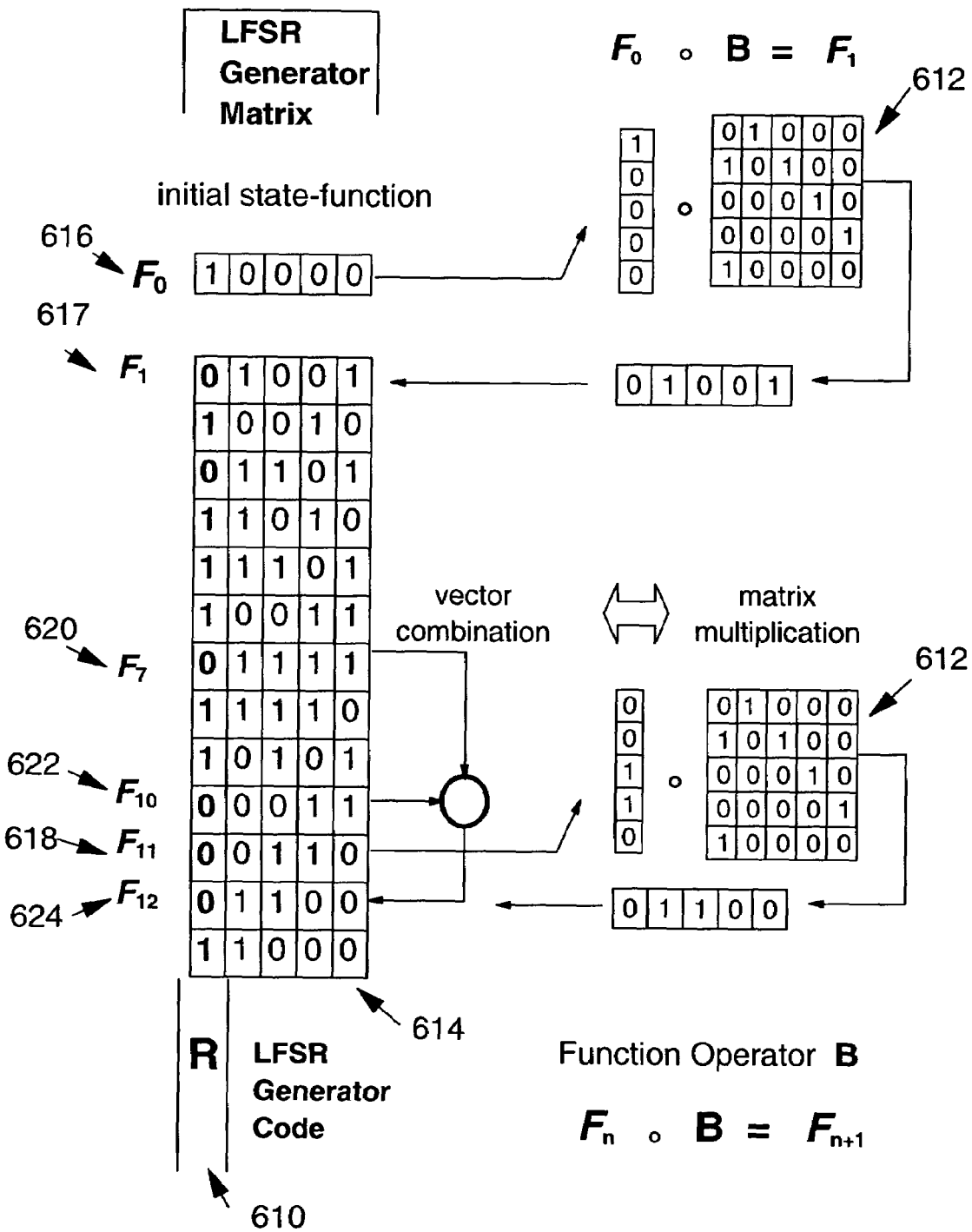
FIG. 6 shows a diagram illustrating a method for building the LFSR Generator Matrix and -Code.
Figure 7:
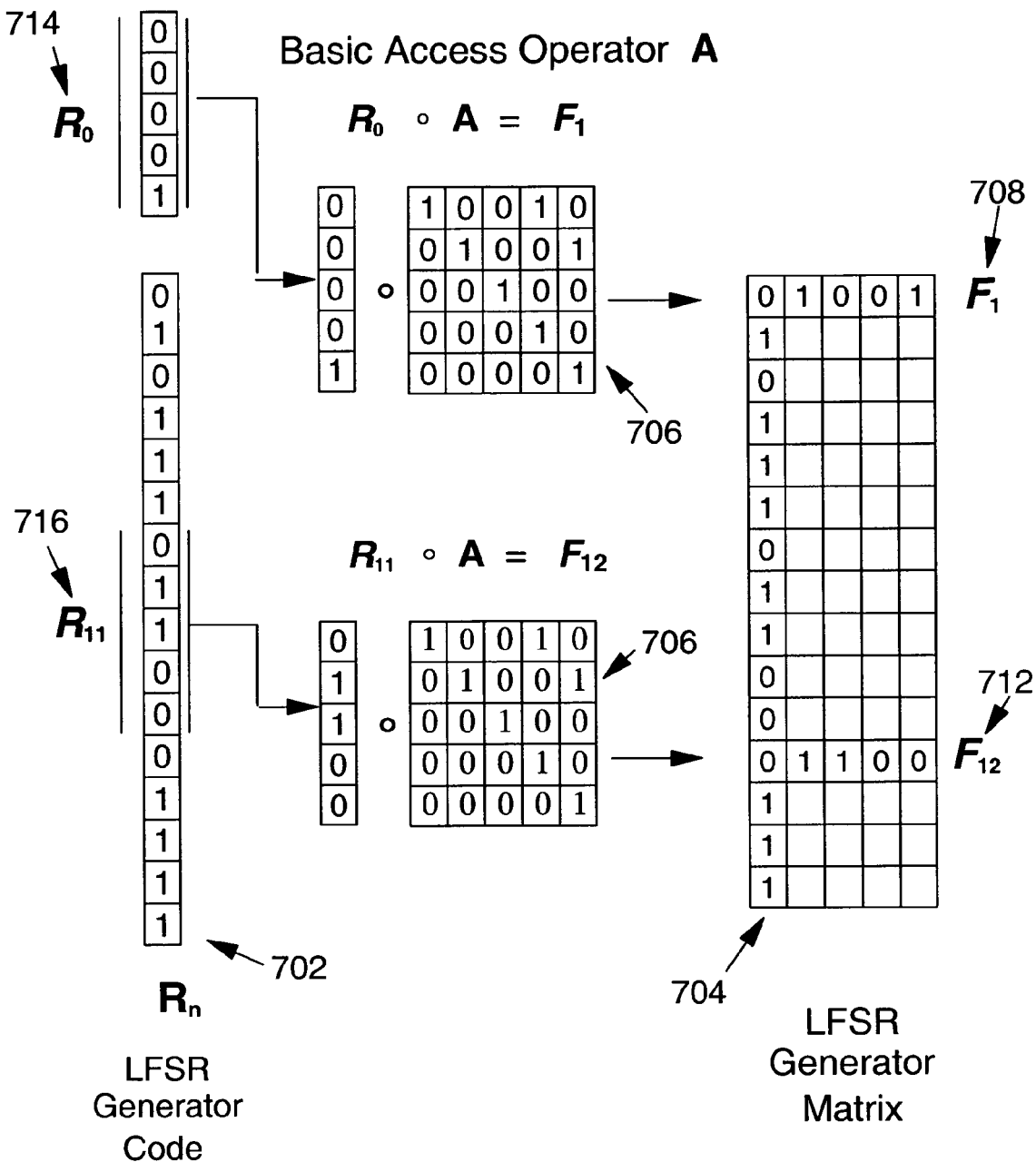
FIG. 7 shows a diagram illustrating the basic access operator to build state-functions.
Figure 8:
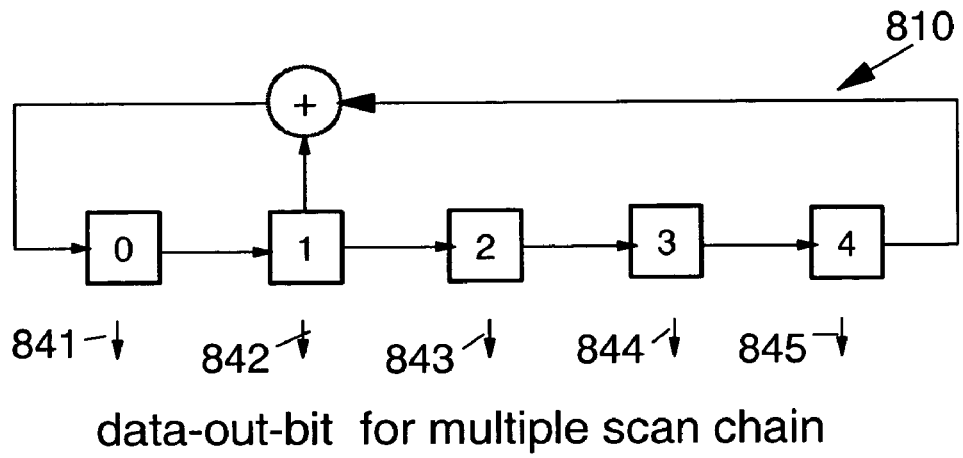
FIG. 8 shows a diagram illustrating a shift- and access operator for multiple data-out-bit.
Figure 8:
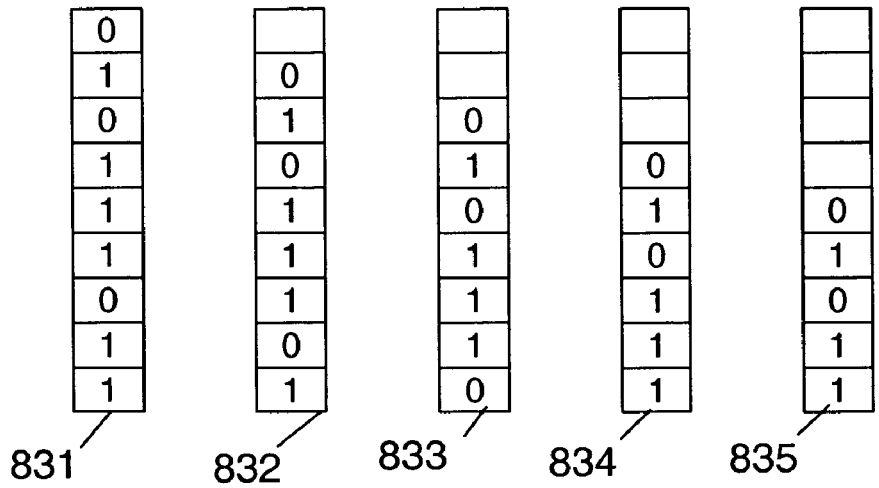
Figure 9:
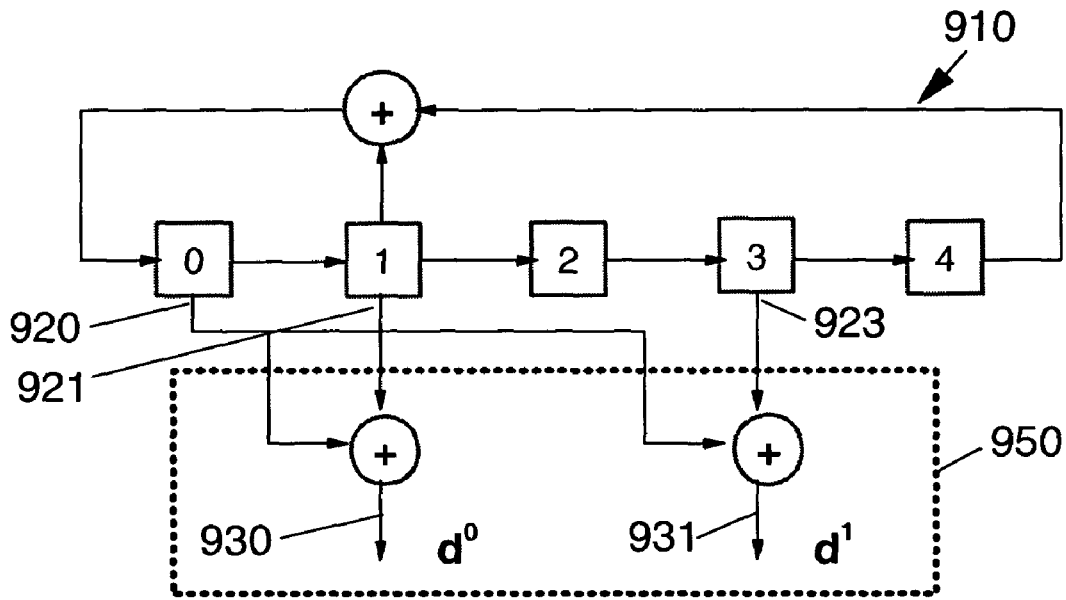
FIG. 9 shows a diagram illustrating a combined shift- and access operator for a spreader network.
Figure 10:
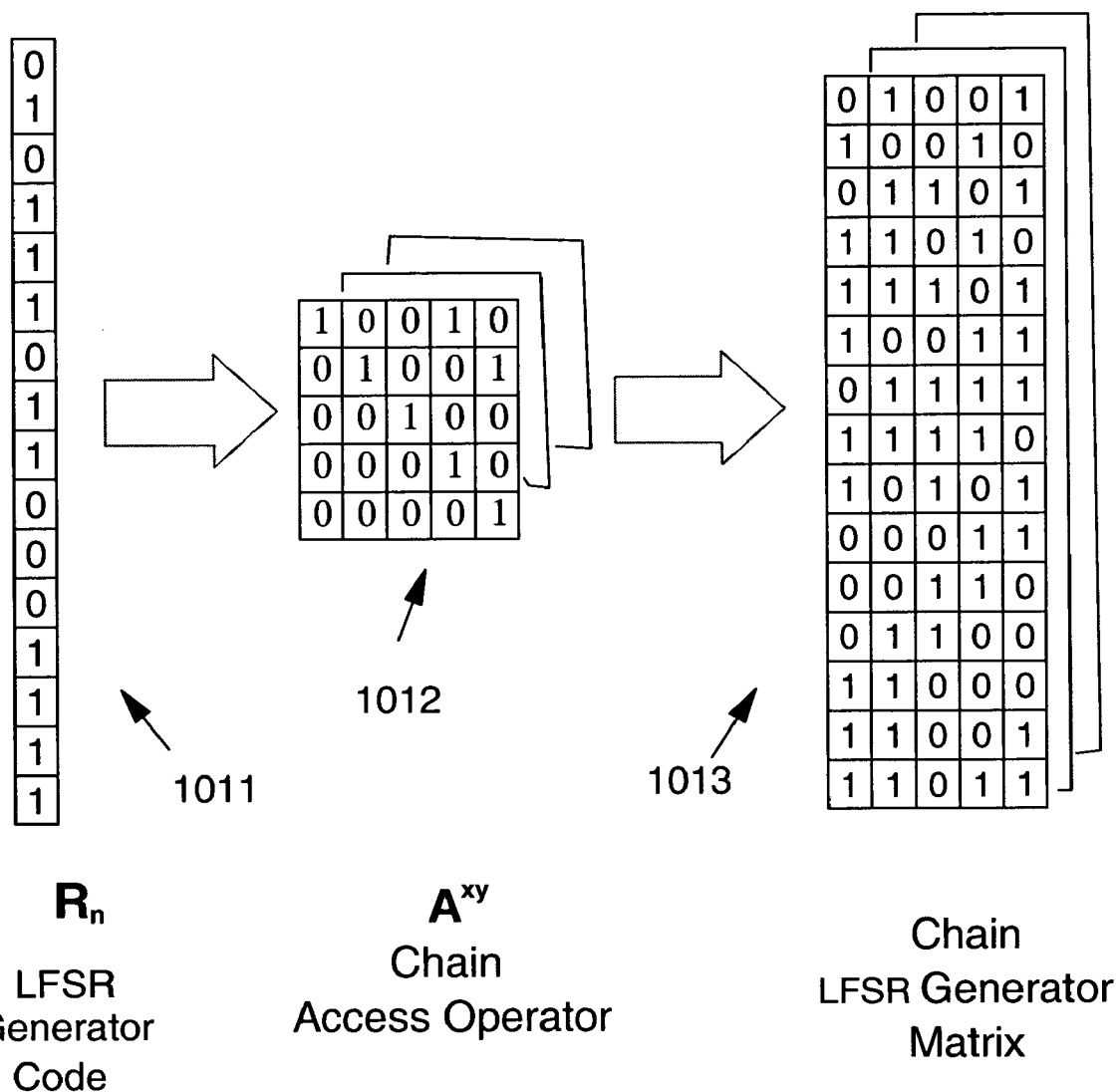
FIG. 10 shows schematically a method for building a set of Chain LFSR Generator Matrices.

FIG. 5 shows schematically a linear feedback shift register (LFSR) as an example of BIT-HW and FIG. 6 shows a diagram illustrating a method for building the LFSR Generator Code. Whereas, FIG. 7 shows a diagram illustrating the Basic Access Operator to build state-functions, FIG. 8 shows a diagram illustrating a shift and access operator for multiple data-out-bit and FIG. 9 shows a diagram illustrating a combined shift- and access operator for spreader network. FIG. 10 illustrates the generation of a set of Chain LFSR Generator Matrices from LFSR Generator Code through Chain Access Operators.

With reference now to FIG. 5, a sample BIT-HW consists of a LFSR 510 including a five-bit shift register 512 (SR). There is one data-out-bit 514, which is directly connected to the output port 516 of the SR 512. This arrangement can be considered as the basic BIT-HW, which can feed only one scan chain by the one data-out-bit 514.

The matrix diagram 530 lists the binary values of the five bits SR 112 over a sequence of 8 clock cycles 515. For this example the initial value 531, also known as SEED, was chosen to '11111'. The values in the next cycles are generated straightforward according to the LFSR feedback XOR-gate as known from the art. Over the running cycles 515 the data-out-bit 514 builds the pseudorandom pattern as known in common LBIST applications. For more details please refer to Albrecht P. Ströle, "Entwurf selbsttestbarer Schaltungen, Teubner-Texte zur Informatik—Band 27", B. G. Teubner Stuttgart—Leibzig, Chapter 4 and following.

FIG. 6 illustrates a method for Building LFSR Generator Code 610. In particularly, this figure corresponds to the sample LFSR shown in FIG. 5 but here in terms of linear algebra. On the right hand side, the so-called function operator B (matrix 612) represents an LFSR. The method for building B in form of a binary matrix 612 is explained with reference to FIG. 4.

On the left hand side, a sequence of vectors is shown, referred to as state-functions $F_n$ (cf. above). The length of these vectors corresponds to the size of the LFSR, and the line index n points to the executed clock cycles in this sequence.

The finite cycle sequence of the state-functions $F_n$ is here called Generator Matrix 614. The resulting LFSR Generator Code 610, namely the binary vector shown in FIG. 3, is just the first row out of this matrix that is the first position of the listed state-functions.

The LFSR Generator Matrix 614 is build by the following iterative procedure:

$$F_{n+1}=F_n \circ B \text{ with } F_0=1\ 0\ 0\ 0\ 0\ \ldots\ 0$$

In FIG. 6 this matrix multiplication is illustrated by two examples, namely for the initial state-function 616 and 618 which correspond to cycle 0 and 11, respectively. The result is the next state-function 617 in cycle 1 and 624 in cycle 12, respectively. The effect of this multiplication is illustrated for the latter example. The shown XOR-combination of state-functions 620 and 622 is a Boolean function being equivalent to the matrix multiplication.

It should be noted that the 0/1-values in the state-functions must not be confused with the data bits being shifted through the running LFSR, which is shown in FIG. 5 for the sample LFSR.

In summary, the LFSR Generator Code 610 represents the functional behavior of the LFSR over the considered interval of clock cycles.

The LFSR Generator Matrix 614 can be considered as an intermediate result in this computation, which does not necessarily need to be stored. Its meaning for LFSR-Coding is explained below with reference to FIG. 10.

In the following the method to build Access Operators is explained. As mentioned above Access Operators transform the LFSR-Generator Code to executable XOR-functions, namely state-functions that are coded as vectors and in total build the LFSR Generator Matrix.

FIG. 7 visualizes how the LFSR Generator Code (vector 702) and the LFSR Generator Matrix (matrix field 704) relate to each other through a Basic Access Operator A (matrix 706). The schematic shown in FIG. 7 corresponds to the sample LFSR shown in FIG. 5, which is the basic BIT-Hardware configuration feeding only one scan chain.

The LFSR Generator Code (vector 702) is a binary vector whose length corresponds to the number of execution cycles. It can be considered as the most compact coding for LFSR cycle executions because each cycle requires just one bit for coding.

The effect of the Basic Access Operator 706 is illustrated by two examples, namely for building state-functions $F_1$ (vector 708) and $F_{12}$ (vector 712) for cycle 1 and 12, respectively.

In this matrix multiplication the inputs are vectors $R_0$ and $R_{11}$, namely sequence-vectors 714 and 716 out of the Generator Code (vector 702). This meaning is indicated by the sidebars in the drawing. The sequence-vectors correspond in length to the LFSR, whereby the initial sequence-vector R0 (vector 714) has always the value 0, 0, . . . , 1.

The LFSR Generator Matrix 704 can be considered as the expanded form of the Generator Code 702 and hence is highly redundant. On the other hand, the state-functions $F_n$ building this matrix are executable XOR-functions and therefore the more suitable input for the LFSR-Coding Unit (not shown in FIG. 7).

In this sense the Basic Access Operator A (matrix 706) can be considered as a decoder used to build the state-functions $F_n$ as needed for LFSR-Coding, which in this case are individually selected according to the test data to be compressed. This procedure is explained below with reference to FIG. 11.

FIG. 8 addresses a basic arrangement for multiple scan chain designs. The upper part shows BIT-HW consisting of the LFSR 810 and five scan chains 831, 832, 833, 834, 835 and the lower part illustrates the corresponding BIT-Code representation, which is in terms of linear algebra.

The shown arrangement is the simplest design in which the scan chains are directly connected to the five LFSR output ports 841, 842, 843, 844, and 845. Due to this direct connection without XOR Spreader the five pseudo-random patterns differ just by an offset of one shift cycle. This is illustrated by the 0/1-values being shifted into the scan chains 831, 832, 833, 834, 835.

In the BIT-Code representation 850 (lower part) the Shift Operator P performs this shift operation, as already shown in FIG. 4. For computing state-functions $F^x$ for scan chains x=0, . . . , 4 different Chain Access Operators $A^x$ 850 are required to access the LFSR Generator Code $R_n$. The figure illustrates how $A^x$ is build by merging Shift Operator $P^x$ and the one basic Access Operator A.

FIG. 9 focuses on multiple scan chains including a Spreader Network. The considered BIT-HW (upper part) consists of the LFSR 910 and Spreader Network 950. In the sample there are three LFSR output ports 920, 921, 923 connected to the Spreader Network 950, and there are two data-out-bits 930 and 931 for feeding two scan chains (not shown in FIG. 9). The usage of a Spreader Network 950 for scrambling pseudorandom patterns by XOR-combinations is known by the art.

In the BIT-Code representation 940 (lower part) this XOR-combination is taken into account by the formula ($P^x+P^y$). The resulting Chain Access Operator $A^{xy}$ performs all three functions in one step, which is decoding, shifting and spreading.

FIG. 10 illustrates the usage of Chain Access Operators to compute state-functions in a multiple scan chain design from one LFSR Generator Code. As already shown above in FIG. 3, the LFSR Generator Code (vector 1011 on the left) and the set of the Chain Access Operators (matrix 1012 in the middle) represent a minimum BIT-Code to be stored. The set of Chain LFSR Generator Matrices (matrix 1013 on the right), that cover the total of all state-functions over all possible cycle executions, need not to be stored. Instead, the state-functions, represented by the lines in the matrix 1012, can be selectively computed as requested by a user or another system for further processing. The details of this computation have been explained above with reference to FIG. 7.

In this sense the Chain Access Operator (matrix 1012) can be considered as a decoder for the extremely compact LFSR Generator Code 1011. Overall this BIT-Code representation has the following advantages for LFSR-Coding, namely, compact coding, fast computation, and universal structure.

In the following the LFSR-Coding Unit (FIG. 1, 120) is explained with reference to FIG. 11. It shows schematically how the LFSR-Coding Unit translates deterministic test vectors into compressed LFSR-Code. It should be noted that this part of the LFSR-Coding procedure refers to the object of this invention, namely efficiently coding of test patterns.

Figure 11:
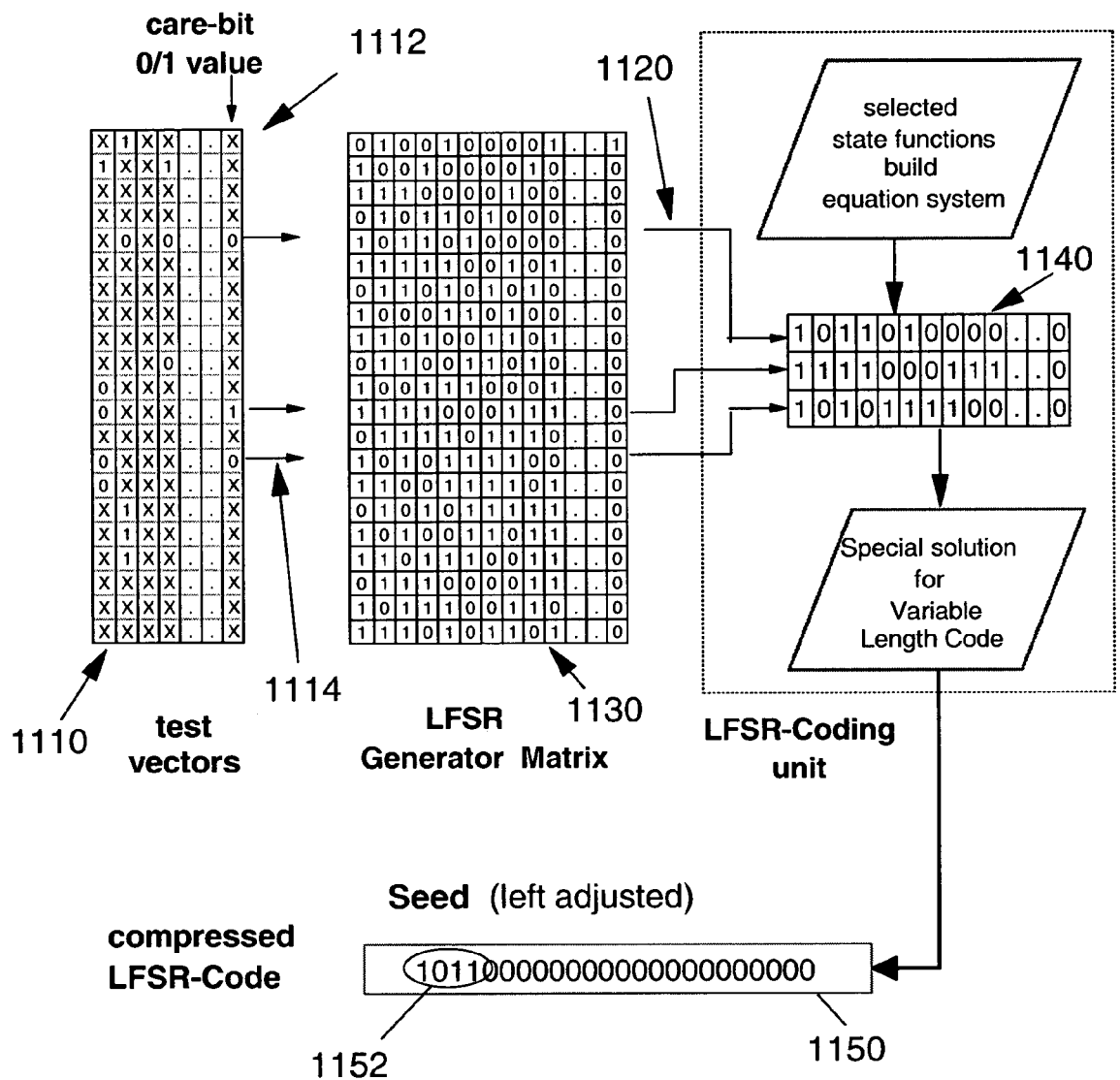
FIG. 11 shows a flow chart illustrating a method for LFSR-Coding according to the present invention.

In FIG. 11, the test data to be compressed is represented by the column matrix 1110 on the left. Herein the columns are test vectors 1112, and the compressed LFSR-Code is the Seed 1150 (line vector on bottom) corresponding to the LFSR (not shown). Furthermore, the BIT-Code is represented by the LFSR Generator Matrix 1130 (box in the middle).

A test vector 1112 specifies so called care-bits, namely 0/1-values 1114 in specific scan chain positions. In relation to the size of the test vector (up to 500,000 SRs) the number of care-bits is extremely small (around 50). The unspecified scan chain positions may be padded by any value x.

The positions of the care-bits 1114 are pointers to the corresponding state-functions 1120 out of the LFSR Generator Matrix 1130. The total of all selected state-vectors represents a linear equation system 1140 (box on right). The resulting Seed 1150 solves this equation system 1140. Methods to solve such equation systems are known by the art.

In general there is a great amount of possible solutions. The so-called Variable Length Code is the one, which shows the longest right adjusted sequence of zeros. In this case the length of the Variable Length Code, i.e. the non-zero field 1152 of the Seed 1150, corresponds directly to the number of care-bits 1114.

At test execution time the LFSR initialized by the Seed 1150 generates a certain test pattern that contains the correct 0/1-values at the care-bit positions 1114. All other positions of the test vector 1112 are padded by pseudorandom values.

The LFSR Generator Matrix 1130 can be considered as a non-sequential model representation of the LFSR running over a certain interval of clock cycles. In this sense a state-function Fn (vector 1120) is a Boolean expression coded in form of a binary vector. It relates to a certain clock cycle n and calculates the 0/1-value for a care-bit 1114 at this cycle by the following action sequence:
  a. Take $F_n$ as a mask for selecting SRs out of LFSR-Seed.
  b. Combine the 0/1-values of the selected SRs by XOR arithmetic.
  c. The XOR-output is the 0/1-value of the care-bit in cycle n.

Obviously, the size of the BIT-Hardware in number and length of chains has no impact on the performance in this LFSR-Coding schematic. This is true because care-bits 1114 directly point to the related state-functions 1120 avoiding any additional computation. Further the state-functions 1120 are coded in form of vectors to be used as binary masks for fast data access, and all computation is reduced to basic Boolean functions. In summary this solution fulfills the objective of efficiently coding of test patterns.

The present invention can be realized in hardware, software, or a combination of hardware and software. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A method for coding test pattern for integrated circuits (ICs) in scan design and with build-in test hardware (BIT-HW), whereby the ICs have IC design data, the BIT-HW consists of a linear feedback shift register (LFSR) for pseudo-random pattern generation and a computer program for pattern merging and distribution over scan chains, the method comprising the steps of:
  generating a logic model representation of the physical BIT-HW;
  specifying test vectors one by one;
  compressing said test vectors one by one; and
  providing the compressed test vectors, whereby said step of generating the logic model representation includes a step of building a function operator and an initial statefunction from respective IC design data, whereby said function operator is an executable logic model representation of the compressed test vectors.

2. The method according to claim 1, whereby the step of generating the logic model representation includes a step of specifying a set of chain access operators from respective IC design data, and whereby each chain access operator corresponds to a certain scan chain and is an executable logic model representation of said computer program for pattern merging and distribution.

3. The method according to claim 2, whereby the step of generating the logic model representation includes a step of building state-functions by building a set of chain LFSR generator matrices from said initial state-function each by iterative executions of said function operator in combination with the respective chain access operators.

4. The method according to claim 1, whereby the step of generating the logic model representation includes a step of generating an LFSR generator code from said initial state-function by an iterative execution of said function operator.

5. The method according to claim 4, whereby the step of generating the logic model representation includes a step of building state-functions by building a set of chain LFSR generator matrices from said LFSR generator code each by iterative executions of the respective chain access operators.

6. The method according to claim 4, whereby said LFSR generator code is a binary vector of a length that corresponds to a certain maximum number of execution cycles of said LFSR.

7. The method according to claim 4, whereby the step of compressing a test vector includes a step of computing and providing a collection of state-functions, whereby the step of specifying a test vector includes a step of specifying a set of care-bits from respective IC design data, and whereby said specification of a care-bit position is the index for selecting a sequence-vector out of the LFSR generator code and for selecting a chain access operator for this computing.

8. The method according to claim 1, whereby the step of generating the logic model representation includes a step of building state-functions by building an LFSR generator matrix line by line beginning with said initial state-function by an iterative execution of said function operator.

9. The method according to claim 8, whereby the LFSR generator matrix is a binary matrix with a line width of the length of the LFSR and a column length of the length of the respective scan chain.

10. The method according to claim 8, whereby said state-function is a binary vector having the length of the LFSR and represents an executable function to be executed by the following action sequence:
i. selecting bit positions of the LFSR in correspondence to the 1-values of the state-function;
ii. combining the 0/1-values of the selected bit positions by XOR arithmetic; and
iii. presenting the XOR-output 0/1-value to a user or to another system for further processing.

11. The method according claim 8, whereby the step of compressing a test vector includes a step of selecting and providing a collection of state-functions out of the LFSR generator matrix, whereby the step of specifying a test vector includes a step of specifying a set of care-bits from respective IC design data, and whereby said specification of the respective care-bit position is the index in this selection.

12. The method according to claim 11, whereby said step of compressing a test vector includes a step of solving a linear equation system formed by said collection of state-functions, whereby the solution is a compressed LFSR-Code.

13. The method according to claim 12, whereby the step of compressing a test vector and solving a linear equation system comprises a method for computing the LFSR-Code in a variable length code, whereby the method provides a special solution characterized by the longest left or right adjusted uniform sequence of either zeros or ones.

14. The method according to claim 13, whereby the step of providing the compressed test vectors in a variable length code includes a step of sorting and grouping the total of compressed test vectors over the individual lengths and storing them in data records having suitable formats for each length interval.

15. The method according to claim 1, whereby the step of specifying a test vector includes a step of specifying a set of care-bits from respective IC design data, specifying for each care-bit a 0/1-value and specifying a position referenced to a specific scan chain and execution cycle in which this 0/1-value is generated by the LFSR.

16. The method according to claim 1, whereby the step of providing the compressed test vectors includes a step of simulating a test execution using the compressed test vectors and providing the simulation results to the user or another system for further processing.

17. A system for coding test pattern for integrated circuits (ICs) in scan design, said system comprising:
build-in test hardware (BIT-HW), whereby the ICs have IC design data;
a linear feedback shift register (LFSR) included in said BIT-HW for pseudorandom pattern generation; and
a computer system including instructions to execute a method for pattern merging and distribution over scan chains, said method comprising the steps of:
generating a logic model representation of the physical BIT-HW;
specifying test vectors one by one;
compressing said test vectors one by one; and
providing the compressed test vectors, whereby said method step of generating the logic model representation includes a step of building a function operator and an initial state-function from respective IC design data, whereby said function operator is an executable logic model representation of the compressed test vectors.

18. The system according to claim 17, whereby the method step of generating the logic model representation includes a step of specifying a set of chain access operators from respective IC design data, and whereby each chain access operator corresponds to a certain scan chain and is an executable logic model representation of said method for pattern merging and distribution.

19. The system according to claim 18, whereby the method step of generating the logic model representation includes a step of generating building state-functions by building a set of chain LFSR generator matrices from said LFSR generator code each by iterative executions of the respective chain access operators.

20. The system according to claim 18, whereby the method step of generating the logic model representation includes a step of generating building state-functions by building a set of chain LFSR generator matrices from said initial state-function each by iterative executions of said function operator in combination with the respective chain access operators.

21. The system according to claim 17, whereby the method step of generating the logic model representation includes a step of generating an LFSR generator code from said initial state-function by an iterative execution of said function operator.

22. The system according to claim 17, whereby the method step of generating the logic model representation includes a step of generating building state-functions by building an LFSR generator matrix line by line beginning with said initial state-function by an iterative execution of said function operator.

23. A program product for coding test pattern for integrated circuits (ICs) in scan design and with buildin test hardware (BIT-HW), whereby the ICs have IC design data, the BIT-HW consists of a linear feedback shift register (LFSR) for pseudo-random pattern generation, the program product comprising:
a computer readable medium having recorded thereon computer readable program code for performing a method of pattern merging and distribution over scan chains, said method comprising the steps of:
generating a logic model representation of the physical BIT-HW;
specifying test vectors one by one;
compressing said test vectors one by one; and
providing the compressed test vectors, whereby said method step of generating the logic model representation includes a step of building a function operator and an initial state-function from respective IC design data, whereby said function operator is an executable logic model representation of the compressed test vectors.

24. The program product according to claim 23, whereby the step of generating the logic model representation includes a step of specifying a set of chain access operators from respective IC design data, and whereby each chain access operator corresponds to a certain scan chain and is an executable logic model representation of said method for pattern merging and distribution.

25. The program product according to claim 24, whereby the method step of generating the logic model representation includes a step of building state-functions by building a set of chain LFSR generator matrices from said initial statefunction each by iterative executions of said function operator in combination with the respective chain access operators.

26. The program product according to claim 23, whereby the method step of generating the logic model representation includes a step of generating an LFSR generator code from said initial state-function by an iterative execution of said function operator.

27. The program product according to claim 26, whereby the method step of generating the logic model representation includes a step of building state-functions by building a set of chain LFSR generator matrices from said LFSR generator code each by iterative executions of the respective chain access operators.

28. The program product according to claim 23, whereby the method step of generating the logic model representation includes a step of building state-functions by building an LFSR generator matrix line by line beginning with said initial state-function by an iterative execution of said function operator.

* * * * *